(12) United States Patent
Wagner et al.

(10) Patent No.: US 8,071,954 B2
(45) Date of Patent: Dec. 6, 2011

(54) HYBRID PHASE PLATE

(75) Inventors: Raymond Wagner, Gorinchem (NL); Hendrik Nicolaas Slingerland, Venlo (NL); Frank Jeroen Pieter Schuurmans, Valkenswaard (NL); Peter Christiaan Tiemeijer, Eindhoven (NL)

(73) Assignee: FEI Company, Hillsboro, OR (US)

( * ) Notice: Subject to any disclaimer, the term of this patent is extended or adjusted under 35 U.S.C. 154(b) by 208 days.

(21) Appl. No.: 12/478,707

(22) Filed: Jun. 4, 2009

(65) Prior Publication Data

US 2009/0302217 A1    Dec. 10, 2009

(30) Foreign Application Priority Data

Jun. 5, 2008 (EP) ..................... 08157619

(51) Int. Cl.
*H01J 37/04* (2006.01)
*G21K 5/04* (2006.01)
*G21K 1/04* (2006.01)

(52) U.S. Cl. ................ 250/396 R; 250/306; 250/307; 250/310; 250/492.21; 250/492.3

(58) Field of Classification Search ........... 250/396 R, 250/306, 307, 310, 492.1, 492.3
See application file for complete search history.

(56) References Cited

U.S. PATENT DOCUMENTS

| 4,853,545 A | 8/1989 | Rose |
| 5,084,622 A | 1/1992 | Rose |
| 5,221,844 A | 6/1993 | van der Mast et al. |
| 5,798,524 A | 8/1998 | Kundmann et al. |
| 5,814,815 A | 9/1998 | Matsumoto et al. |
| 5,838,011 A | 11/1998 | Krijn et al. |
| 5,986,269 A | 11/1999 | Krijn et al. |
| 6,184,975 B1 | 2/2001 | Henstra et al. |

(Continued)

FOREIGN PATENT DOCUMENTS

WO    WO03032351    4/2003

(Continued)

OTHER PUBLICATIONS

Spence, John C. H., "High-Resolution Electron Microscopy," 2004, pp. 61-88,.

(Continued)

*Primary Examiner* — Nikita Wells
(74) *Attorney, Agent, or Firm* — Scheinberg & Griner, LLP; Michael O. Scheinberg; David Griner

(57) ABSTRACT

The invention relates to a hybrid phase plate for use in a TEM. The phase plate according to the invention resembles a Boersch phase plate in which a Zernike phase plate is mounted. As a result the phase plate according to the invention resembles a Boersch phase plate for electrons scattered to such an extent that they pass outside the central structure (15) and resembles a Zernike phase plate for scattered electrons passing through the bore of the central structure. Comparing the phase plate of the invention with a Zernike phase plate is has the advantage that for electrons that are scattered over a large angle, no electrons are absorbed or scattered by a foil, resulting in a better high resolution performance of the TEM. Comparing the phase plate of the invention with a Boersch phase plate the demands for miniaturization of the central structure are less severe.

22 Claims, 13 Drawing Sheets

U.S. PATENT DOCUMENTS

| | | | |
|---|---|---|---|
| 6,191,423 B1 | 2/2001 | Krijn et al. | |
| 6,246,058 B1 | 6/2001 | Tiemeijer | |
| 6,329,659 B1 | 12/2001 | Krijn et al. | |
| 6,605,810 B1 | 8/2003 | Haider et al. | |
| 6,744,048 B2 | 6/2004 | Hosokawa et al. | |
| 7,378,667 B2 | 5/2008 | Henstra | |
| 7,737,412 B2* | 6/2010 | Jin et al. | 250/396 R |
| 7,884,326 B2* | 2/2011 | van de Water et al. | 250/311 |
| 2002/0011566 A1 | 1/2002 | Nagayama et al. | |
| 2003/0066964 A1 | 4/2003 | Nagayama et al. | |
| 2007/0284528 A1 | 12/2007 | Benner et al. | |
| 2008/0035854 A1 | 2/2008 | Jin et al. | |
| 2008/0202918 A1 | 8/2008 | Nagayama et al. | |
| 2008/0290264 A1 | 11/2008 | Henstra et al. | |
| 2009/0200464 A1 | 8/2009 | Tiemeijer et al. | |
| 2010/0065741 A1 | 3/2010 | Gerthsen et al. | |

FOREIGN PATENT DOCUMENTS

| | | |
|---|---|---|
| WO | 03068399 | 8/2003 |
| WO | 2006017252 | 2/2006 |
| WO | 2007052723 | 5/2007 |

OTHER PUBLICATIONS

"Press Release: New Electron Microscope: Groundbreaking Development Project for Biotechnologies," Feb. 2007, 3 pgs.

"Lens Aberrations," 1 pg.

Glaeser. R.M., et al, "Adapting the Spatial-Frequency Band Pass of In-Focus Phase-Contrast Apertures for Biological Applications," Microsc Microanal, 2007, pp. 1214-1215, vol. 13, Suppl 2.

Gerthsen, D., et al, 'Effect of a Physical Phase Plate on Contrast Transfer in an Aberration-Corrected Transmission Electron Microscope,' Microsc Microanal, 2007, pp. 126-127, vol. 13, Suppl 2.

Boersch, H., "Uber die Moglichkeit der Abbildung von Atomen im Elektronenmikroskop," Z Naturforschung 2A, 1947, pp. 615-633.

Downing, Kenneth H. et al., "Discrimination of Heavy and Light Components in Electron Microscopy Using Single-Sideband Holographic Tenchiques," Optik, 1975, pp. 155-175, vol. 42, No. 2.

Danev, Radostin et al., "Transmission Electron Microscopy with Zernike Phase Plate", Science Direct-Ultramicroscopy, Sep. 2001, pp. 243-252, vol. 88, Issue 4.

Osakabe, Nobuyuki, et al., "Experimental confirmation of Aharonov-Bohm effect using a toroidal magnetic field confined by a superconductor," Physical Review A, Aug. 1986, vol. 34, No. 2, 18 pages.

* cited by examiner

HYBRID PHASE PLATE

FIELD OF THE INVENTION

The invention relates to a phase plate for use in a particle-optical apparatus, said phase plate to be irradiated by a beam of particles, said phase plate comprising a central structure that is non-transparent to particles, said central structure surrounding a through-hole for passing a part of the beam, said central structure surrounded by an area transparent to particles, said central structure equipped to cause a phase shift between the part of the beam passing through the through-hole and the part of the beam passing outside the central structure.

The invention further relates to a method using such a phase plate.

BACKGROUND OF THE INVENTION

In a Transmission Electron Microscope (TEM) a beam of electrons produced by an electron source is formed into a parallel beam of electrons illuminating the sample. The sample is very thin, so that part of the electrons pass through the sample and part of the electrons are absorbed in the sample. Some of the electrons are scattered in the sample so that they exit the sample under a different angle than under which they enter the sample, while others pass through the sample without scattering. By imaging the sample on a detector, such as a fluorescent screen or a CCD camera, intensity variations result in the image plane. The intensity fluctuations are in part due to the absorption of electrons by the sample, and in part to interference between scattered and unscattered electrons. The latter mechanism is especially important when observing samples in which little electrons are absorbed, e.g. low-Z materials such as biological tissues.

The contrast of the image resulting from electrons interfering with each other can, for parallel illumination, be explained as follows:

A parallel illumination can be described in Fourier space as a distribution $\delta(G)$ where $\delta$ denotes the well-known Dirac delta function which is only non-zero at G=0, and G denotes spatial frequency. The scattering of the incoming beam is described by the specimen function $\phi(G)$. The beam $\Psi_0(G)$ immediately after the specimen becomes $$\Psi_0(G)=\delta(G)-i\phi(G) \quad [1]$$

The imaging system, and in particular the objective lens of the TEM, aberrates this wave to $$\Psi(G)=\delta(G)-i\phi(G)\exp[2\pi i\chi(G)] \quad [2]$$

where $\chi(G)$ is the aberration function which depends on parameters like defocus and spherical aberration. The intensity at the detector is equal to the convolution of $\Psi(G)$ with its complex conjugate $\Psi(G)^*$, $$I(G)=\Psi(G)^*\Psi^*(G) \quad [3a]$$

This can be written as $$I(G)=\delta(G)-i\phi(G)\exp[2\pi i\chi(G)]+i\phi^*(-G)\exp[-2\pi i\chi(-G)]+\phi(G)\exp[2\pi i\chi(G)]^*\phi^*(-G)\exp[-2\pi i\chi(-G)] \quad [3b]$$

As in Fourier space both frequencies G and −G are present, and since $\phi(x)$ is a real function, $\phi^*(-G)$ can be replaced with $\phi(G)$.

$$\phi^*(-G)=\phi(G) \quad [4]$$

Similarly, since $\chi(G)$ is even in G, $\chi(-G)$ can be replaced with $\chi(G)$.

$$\chi(G)=\chi(-G) \quad [5]$$

The expression for the intensity simplifies to $$I(G)=\delta(G)-2\phi(G)\sin[2\pi i\chi(G)]+\phi(G)\exp[2\pi i\chi(G)]^*\phi(G)\exp[-2\pi i\chi(G)] \quad [6]$$

The factor $\sin[2\pi i\chi(G)]$ is called the Contrast Transfer Function (CTF):

$$CTF(G)=\sin[2\pi i\chi(G)] \quad [7]$$

The term quadratic in $\phi(G)$ is small and is usually neglected.

Objects with a specific spatial frequency scatter the beam over a specific angle, the scattering angle being proportional to the spatial frequency. For low spatial frequencies the scattering angle is close to zero and the contrast is close to zero as $\chi(G)$ and consequently the CTF is almost zero. For higher spatial frequencies the contrast fluctuates due to the positive and a negative values for the CTF, depending on the spatial frequency. As the CTF is close to zero for low spatial frequencies, large structure cannot be resolved in the image.

In 1947 Boersch described that the introduction of a phase plate would result in a CTF where low spatial frequencies show a maximum, and large structures can thus be imaged, see "Über die Kontraste von Atomen im Elektronenmikroskop", H. Boersch, Z. Naturforschung 2A (1947), p. 615-633. Recently such phase plates have successfully been introduced in TEM's.

A phase plate is a structure that is placed in a plane where the beam illuminating the sample, after having passed through the sample, is focused to a spot by the so-named objective lens.

It is noted that a phase plate can also be placed in a plane that is an image of the plane where the objective lens focuses the beam to a spot.

Usually, the illuminating beam is a parallel beam, and then the plane where the beam is focused to a spot is the back-focal plane of the objective lens. If the illuminating beam is not a parallel beam, but close to parallel, then this plane is close to the back-focal plane of the objective lens or close to an image of said plane. In the plane of the phase plate all unscattered electrons are focused in one point, while scattered electrons are imaged at other positions. The phase plate causes a phase shift $\theta$ between scattered and unscattered electrons. Therefore equation [2] is modified to $$\Psi(G)=\delta(G)-i\phi(G)\exp[2\pi i\chi(G)+\theta] \quad [8]$$

and thus equation [7] to $$CTF(G)=\sin[2\pi i\chi(G)+\theta] \quad [9]$$

By choosing $\theta=\pi/2$ (or more general: $\theta=\pi/2+2n\pi$, with n an integer), this reduces to $$CTF(G)=\cos[2\pi i\chi(G)] \quad [10]$$

thereby converting the sine-like behaviour of the CTF to a cosine-like behaviour. It is noted that a phase shift of $\theta=-\pi/2$ also causes a cosine-like behaviour of the CTF. It is further noted that a marked improvement of the contrast may also occur for phase shifts other than $\theta=\pi/2+n\pi$.

For a more detailed derivation of the formulae the reader is referred to "High-resolution electron microscopy", J. C. H. Spence, 3rd edition (2003), ISBN 0198509154, more specifically to paragraph 3.4 and chapter 4.

In a so-named Boersch phase plate such a phase shift is caused by temporary accelerating or decelerating the unscattered electrons.

A Boersch phase plate must have a very small diameter to allow (most of the) scattered electrons to pass without intercepting these scattered electrons by the physical structure of the phase plate. The manufacturing of such a phase plate is described in e.g. U.S. Pat. No. 5,814,815 to Hitachi.

The known phase plate comprises a grounded ring-like structure with an inner electrode, thus resembling a miniature electrostatic Einzellens. The electrons passing through the phase plate are temporarily accelerated or decelerated. By a proper choice of the voltage on the inner electrode the phase shift θ of the electrons is e.g. plus or minus π/2. The electrons that are passing outside the miniature lens do not experience the phase shift. By positioning the phase plate in a plane where the beam illuminating the sample is focused to a point and centering it round the axis of the objective lens, the unscattered electrons experience the phase shift, while all electrons that are scattered pass outside the phase plate and thus do not experience the phase shift.

A problem of the known phase plate is that the central structure intercepts electrons, thereby blocking electrons scattered over a small angle. These electrons are necessary to image structures with a low spatial frequency. Large structures can thus not be imaged with such a phase plate.

It is noted that any scattered electrons that also pass through the phase plate, because they are scattered over a very small angle, will experience the same phase shift as the unscattered electrons and can thus not interfere with the unscattered electrons to form a high contrast image.

A disadvantage of the known phase plate is that large structures can not be imaged as the scattered electrons carrying the information with low spatial resolution are either blocked by the physical structure of the phase plate or experience the same phase shift as the unscattered electrons. This makes it difficult to navigate to points of interest in the sample, or to observe the position of a high resolution feature, such as a lipid bi-layer, in a large feature, such as a cell.

It is noted that another type of Boersch phase plate is described in International Application WO2006/017252 to Glaeser. This phase plate comprises a central ring electrode surrounded by a grounded ring electrode. Herewith an electric field can be generated on the axis, thereby accelerating or decelerating the unscattered electrons, while the grounded electrode acts as a shield so that scattered electrons do not experience a phase shift. The disadvantages mentioned for the phase plate of U.S. Pat. No. 5,814,815 are equably applicable.

SUMMARY OF THE INVENTION

The invention relates to a hybrid phase plate for use in a TEM. The phase plate according to the invention resembles a Boersch phase plate in which a Zernike phase plate is mounted. As a result the phase plate according to the invention resembles a Boersch phase plate for electrons scattered to such an extent that they pass outside the central structure (15) and resembles a Zernike phase plate for scattered electrons passing through the bore of the central structure. Comparing the phase plate of the invention with a Zernike phase plate, the invention is has the advantage that for electrons that are scattered over a large angle, no electrons are absorbed or scattered by a foil, resulting in a better high resolution performance of the TEM. Comparing the phase plate of the invention with a Boersch phase plate the demands for miniaturization of the central structure are less severe.

BRIEF DESCRIPTION OF THE DRAWINGS

The invention is now elucidated with the help of figures, where identical numerals refer to corresponding features.

To that end.

DETAILED DESCRIPTION OF THE DRAWINGS

Figure 1A:
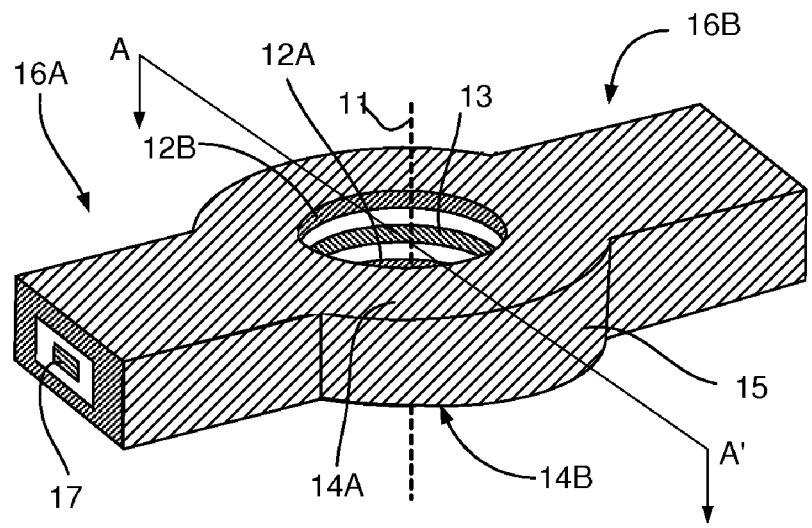
FIGS. 1A and 1B schematically show a prior art Boersch phase plate.

There is a demand for a phase plate with which both large and small features can be imaged.

To that end the phase plate according to the invention is characterized in that the central structure comprises a foil transparent to particles, said foil surrounding the central trough-hole, said foil equipped to cause a phase shift between the part of the beam passing through the through-hole and the part of the beam passing through the foil.

When electrons pass through a foil, such as a carbon foil, they experience a phase shift due to the internal potential of the foil.

In the phase plate according to the invention the electrons passing through the central hole experience a phase shift due to the acceleration or deceleration of the electrons in the central structure.

The electrons passing through the foil of the central structure experience a phase shift due to the internal potential of the foil as well as a phase shift due to the acceleration or deceleration of the electrons in the central structure. By proper combination of these two phase shifts a combined phase shift of these electrons can be achieved resulting in constructive interference of these electrons with the unscattered electrons, resulting in a high contrast of large features.

The electrons passing outside the central structure do not experience a phase shift and can thus interfere constructively with the unscattered electrons.

By incorporating a foil in the central structure of the phase plate, it is possible to make the central hole through which the unscattered electrons must pass much smaller than the central hole of the known Boersch phase plate. The known Boersch phase plates exhibit a central hole of approximately 1 µm, while a hole of e.g. 100 nm or less can be drilled in a foil using e.g. focused ion beam milling. It is noted that the objective lens focuses the unscattered beam in a spot with a typical diameter of between 50 and 200 nm, depending on the magnification between the particle source and the phase plate.

Another advantage is that the central structure need not be so small, as also scattered electrons passing through the central structure are phase shifted with respect to the unscattered electrons.

It is noted that another type of phase plate, the so-named Zernike phase plate, also uses a foil with a hole with similar—small—diameter and thus is capable to image structures as large as those imaged with the phase plate according to the invention. The Zernike phase plate consists of a thin foil with a central hole in it. The electrons travelling through the foil experience a phase shift due to the internal potential of the foil, while the electrons passing through the central hole do not experience a phase shift. By a proper choice of the thickness of the foil the phase shift can be $\pi/2$, and thus the required improvement in resolution occurs. Such a phase plate is described in e.g. "Transmission electron microscopy with Zernike phase plate", R. Danev et al., Ultramicroscopy 88 (2001), pages 243-252.

A problem with Zernike phase plates is that all scattered electrons have to travel through the foil. In the foil scattering of these electrons occurs, resulting in a blurring of the image and/or a degradation of the signal-to-noise ratio. Typically 30% of the electrons are absorbed or scattered by the foil, thereby reducing the CTF to 70% compared to that of an 'ideal' phase plate. This especially impacts the highest obtainable resolution of the TEM, resulting in a reduced performance of the TEM. This is in contrast with the phase plate according to the invention, where electrons scattered over a large angle pass outside the central structure and do not pass through a foil.

In an embodiment of the phase plate according to the invention the foil is a carbon foil.

The use of a carbon foil for use in a Zernike phase plate is already well-known. Its conductivity and its transparency, as well as its mechanical properties, make it the material of choice for this application.

In another embodiment of the phase plate according to the invention in which for at least one line in the plane of the phase plate and passing through the centre of the through-hole, said line thus intersecting the central structure at two opposite sides, the at least one line intersects the central structure from a distance $R_1$ to a distance of $R_2$ from the through-hole in one direction, and a distance from $R_3$ to a distance of $R_4$ from the through-hole in the other direction, with $R_3 \geq R_2$.

In this embodiment the phase plate will, in at least one direction (the direction of the line), block particles scattered over an angle $\alpha$, but at the same time pass particles scattered over an angle $-\alpha$. This is known as single sideband imaging. Therefore the assumption of formula [4] cannot be followed, and instead of formula [6] the intensity is given by:

$$I(G) = \delta(G) - 2i\phi(G)\exp[2\pi i \chi(G) + \theta] \quad [11]$$

and the CTF changes to $$CTF(G) = 2i\exp[2\pi i \chi(G) + \theta] \quad [12]$$

The effect of an imaginary CTF is described in "Discrimination of heavy and light components in electron microscopy using single-sideband holographic techniques", K. H. Downing et al., Optik 42 (1975), No. 2, pages 155-175, showing that the CTF being imaginary implies a shift of the structures corresponding to the spatial frequency concerned. However, an intensity variation is obtained in the image plane.

In a further embodiment of the phase plate according to the invention the central structure is formed from two half-annuli, one half-annulus with inner radius $R_1$ and outer radius $R_2$, and the other half-annulus with an inner radius of $R_3$ and an outer radius of $R_4$, and in which $R_3 \geq R_2$, and the through-hole is located at the centre points of the two annuli from which the two half-annuli are formed.

In this preferred embodiment the phase plate is formed such that for as much as possible blocking of particles scattered over an angle $\alpha$ is compensated with unblocked passage of particles deflected over an angle $-\alpha$, and further that the reduced CTF, resulting of only passing half of the scattered particles for certain scattering ranges, occurs for the same spatial frequencies in different directions. This results in an image with the least artefacts introduced in the image due to missing spatial frequencies and/or different missing spatial frequencies in different directions.

It is noted that, as the two half-annuli from which the central structure is formed must be joined together, for a limited direction no compensation can occur, as will be shown later in the detailed description of figures.

In an aspect of the invention a particle-optical apparatus equipped with a phase plate and equipped with an objective lens, said particle-optical apparatus illuminating a sample with a beam of particles, the phase plate placed substantially in a plane where the beam illuminating the sample is focused, in which the phase plate is the phase plate according to the invention.

This aspect describes the position where the phase plate according to the invention should be placed.

In an embodiment of the apparatus according to the invention, in working, the combined phase shift caused by the foil and the central structure results in a phase shift $\phi$ of substantially $\theta = n \cdot \pi$ for the particles transmitted through the foil, with $n$ an integer.

By choosing the phase difference between the unscattered electrons and the scattered electrons that pass through the foil equal to $n \cdot \pi$, the CTF for the associated spatial frequency range becomes either 1 or −1, corresponding with an optimal positive or negative contrast.

It is noted that the increase in contrast at low spatial frequencies is caused by changing a sine to a cosine, as discussed earlier. Optimum gain occurs at a phase shift $\theta = \pi/2 + n \cdot \pi$, but also a marked increase in contrast may be obtained at other phase shifts. Therefore a marked increase in CTF can be realized even when the phase shift of the foil does not completely counteract the phase shift caused by the electric field of the central structure.

In a further embodiment of the apparatus according to the invention, in working, the combined phase shift caused by the foil and the central structure results in a phase shift $\theta$ of substantially $\theta = 0$ for the particles transmitted through the foil.

In this embodiment the phase shift experienced by the unscattered electrons is equal to but of opposite sign of the phase shift caused by the foil. The electrons passing through the foil thus experience no net phase shift so that constructive interference with the unscattered electrons (which did experience a phase shift) can occur.

In another embodiment of the apparatus according to the invention the apparatus is equipped to image the back-focal plane of the objective lens on the phase plate with a variable magnification.

By choosing the magnification with which the back-focal plane is imaged on the phase plate, the user of the apparatus has the option of choosing which particles are intercepted or affected by the physical structure of the phase plate. As the intercepted electrons cannot contribute to the image, the CTF for the spatial resolution corresponding to these blocked electrons is reduced, corresponding to a band in the CTF where the CFT shows a different behaviour. The position of this band in terms of spatial frequency can be tuned, e.g. centering said band round a zero of the CFT.

In an aspect of the invention a method of forming an image using a particle-optical apparatus equipped with an objective lens for illuminating a sample and a phase plate, the particle-optical apparatus equipped to image the plane where the objective lens forms a focus onto the phase plate, is characterized in that
 the particle-optical apparatus is equipped with the phase plate according to the invention, and
 the particle-optical apparatus is equipped to image the plane where the objective lens forms a focus onto the phase plate with a variable magnification, and the method comprises:
- determining a desired lower spatial frequency range of the image, said lower spatial frequency range caused by the interference of particles transmitted through the foil with particles passing through the through-hole,
- determining a desired higher spatial frequency range of the image, said higher spatial frequency range caused by the interference of particles transmitted around the central structure with particles passing through the through-hole, and
- adjusting the magnification with which the back-focal plane is imaged on the phase plate so that particles corresponding with said lower and the higher spatial frequency range are not intercepted by the central structure.

By adjusting the magnification such, that interception of particles and the resulting loss in spatial information occurs in a less interesting frequency range, an image can be obtained in which, for example, large details are imaged so as to determine the position of small details, while details with intermediate size are less visible.

Also, this method can be used to centre the band where the central structure intercepts particles round a zero of the CTF, as contrast is reduced anyway and therefore the effect of a change of CTF due to the interception is reduced as well.

It is noted that the position where the CTF shows a zero is dependent on e.g. the distance of the specimen to the back-focal plane, the so-named defocus distance.

In an embodiment of the method according to the invention determining a lower spatial frequency range and determining a higher spatial frequency range takes the form of determining a central spatial frequency around which said lower spatial frequency range and said higher spatial frequency range are centred.

In this embodiment the spatial frequencies are selected by centering them round a desired spatial frequency.

Figure 1B:
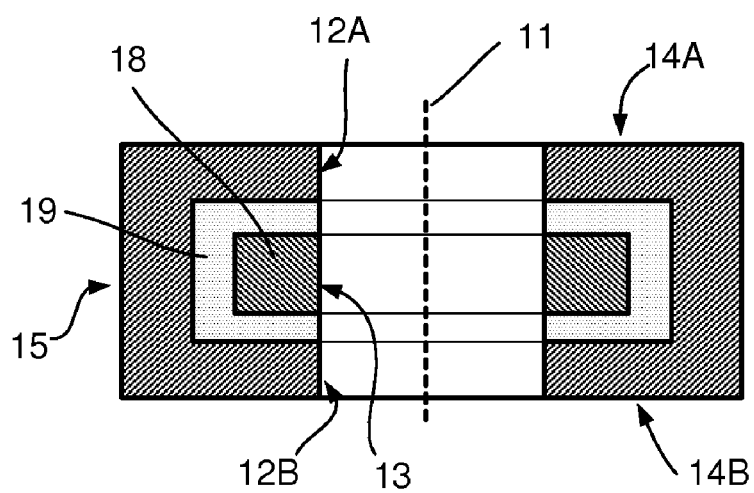

FIG. 1A and FIG. 1B schematically show a prior art Boersch phase plate as described in e.g. U.S. Pat. No. 5,814,815.

A central structure in the form of a cylinder is shown with a bore along its axis 11, the inside of the bore showing three ring-shaped electrodes 12A, 12B and 13 arranged round the axis of the cylinder. The middle electrode 13 is insulated from the two outer electrodes 12A and 12B, while the two outer electrodes are electrically connected to each other. The conductive outer surface comprising surfaces 14A, 14B and 15 of the cylinder is formed by a conductive surface, the outer electrodes 12A, 12B part of said conductive outer surface.

From the phase plate two spokes 16A, 16B extend to hold the phase plate. The outside of the spokes shows an electrically conductive layer connected to the conductive outer surface of the cylinder. At least one of the spokes shows an inner conductive track 17 insulated from the outer layer, the inner track electrically connected to the middle electrode 13.

It is noted that phase plates with only one spoke are known, as well as phase plates with more than 2 spokes.

By applying a voltage to the middle electrode electrons of the unscattered beam (passing through the bore) will travel slower or faster (depending on the voltage of the middle electrode) than electrons travelling outside the cylinder. This is equivalent to the unscattered part of the beam experiencing a phase shift with respect to the scattered part of the beam, as the scattered part of the beam is unaffected by the voltage of the middle electrode.

The actual phase shift depends on the energy of the electrons and the voltage on the middle electrode. By proper choice of the voltage a phase shift of $\pi/2$ or $-\pi/2$ is realized. The conductive outer layer surrounds the cylinder so as to cause a uniform phase shift between the unscattered electrons and the scattered electrons, independent under which angle the scattered electrons are scattered, and thus how far removed the scattered electrons are from the cylinder. The conductive layer confines the effect of the middle electrode 13 to the unscattered beam, and prevents an electric field outside the cylinder due to the voltage on middle electrode 13. Therefore any electrons passing outside the cylinder do not experience a phase shift.

Figure 2A:
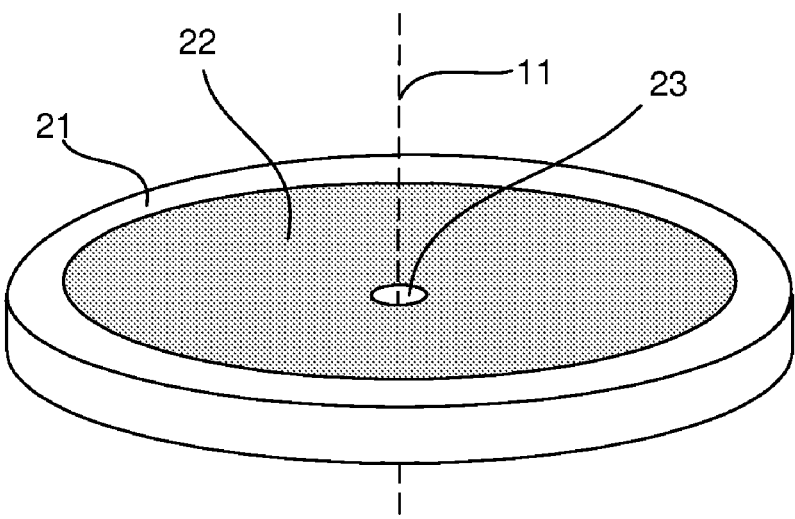
FIGS. 2A and 2B schematically show a prior art Zernike phase plate.
Figure 2B:
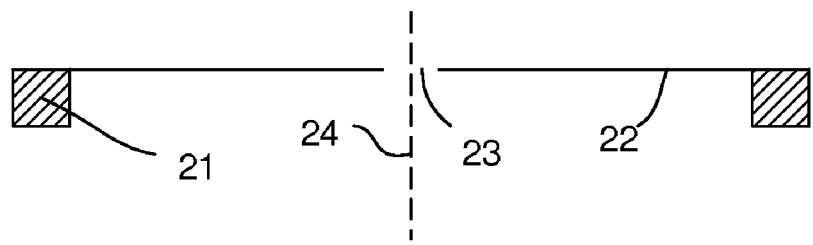

FIGS. 2A and 2B schematically show a prior art Zernike phase plate.

A carbon foil 22 is attached to a carrier 21, such as a standard platinum aperture. The carbon foil shows an aperture 23 for passing the unscattered electrons. All other electrons, that is: all scattered electrons which contribute to the image, pass through the foil. Passing the foil these electrons experience a phase shift. The actual phase shift depends on the energy of the electrons and the thickness of the foil. By proper choice of the thickness a phase shift of $\pi/2$ is realized.

It is noted that the phase shift caused by a Zernike phase plate, contrary to the phase shift caused by a Boersch phase plate, cannot be tuned.

Therefore a Zernike phase plate may show the optimal phase shift needed for a 200 keV electron beam, but not for a 300 keV beam.

It is further noted that a Zernike phase plate typically 30% or more of the electrons are absorbed or scattered by the foil, thereby reducing the CTF by 30% or more. This especially impacts the high resolution performance of the TEM, limited by the signal-to-noise ratio.

Figure 3A:
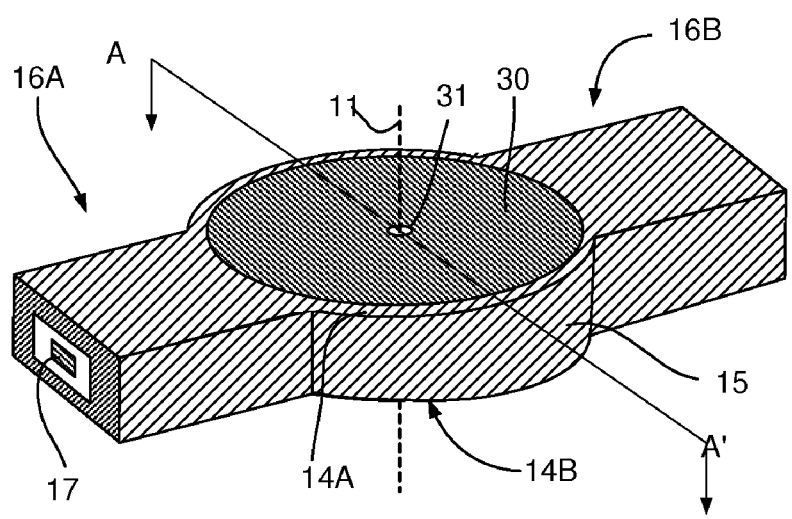
FIGS. 3A and 3B schematically show a phase plate according to the invention.
Figure 3B:
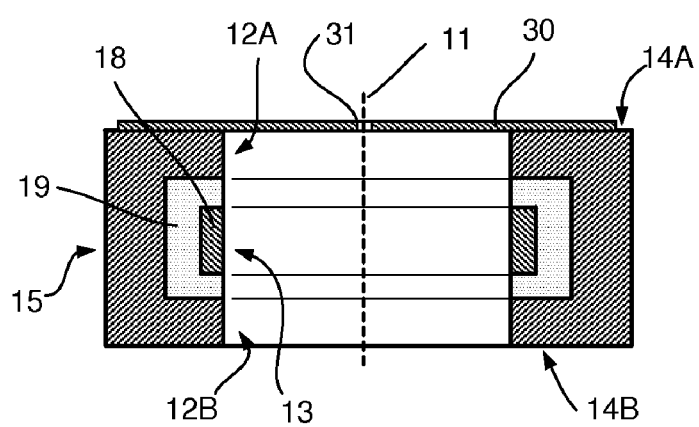

FIGS. 3A and 3B schematically show a phase plate according to the invention.

FIG. 3A and FIG. 3B can be thought to be derived from FIGS. 1A and 1B, respectively. A carbon foil 30 is adhered to the central structure, said foil showing a through-hole 31. Electrons passing through the through-hole experience a phase shift of e.g. $-\pi/2$ due to the field caused by middle electrode 13. Electrons passing through the foil (and not stopped by the central structure), experience a phase shift of $\pi/2$ due to the foil, and a phase shift of $-\pi/2$ due to the field caused by the middle electrode. The net phase shift for these electrons is thus zero. Electrons passing outside the central structure also experience phase shift 0, as discussed before. Therefore a phase shift difference of $\pi/2$ is provided for all scattered electrons with respect to the unscattered electrons.

FIGS. 4A, 4B, 4C and 4D schematically show exemplary CTF curves for different situations.

Figure 4A:
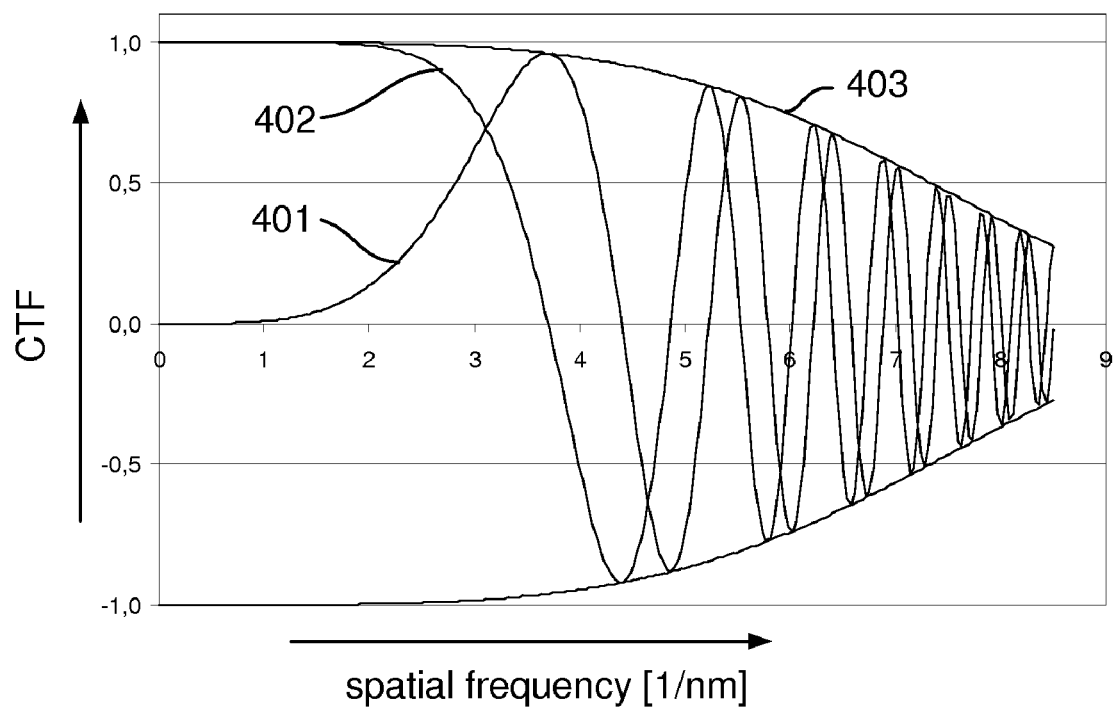
FIGS. 4A-4D schematically show the CTF of a TEM without and with a phase plate.

FIG. 4A shows an exemplary CFT curve 401 for a conventional TEM (that is: a TEM without a phase plate) and an exemplary CFT curve 402 for an identical TEM equipped with an ideal phase plate. Under an ideal phase plate a phase plate not intercepting scattered electrons and not introducing additional scattering is understood.

The CTF is a function of the spatial frequency, here expressed in lines per nanometer. The envelope 403 of the CTF functions is governed by system parameters, such as the spherical and chromatic aberration coefficients of the objective lens, the energy spread of the beam, the opening angle, etc.

Figure 5A:
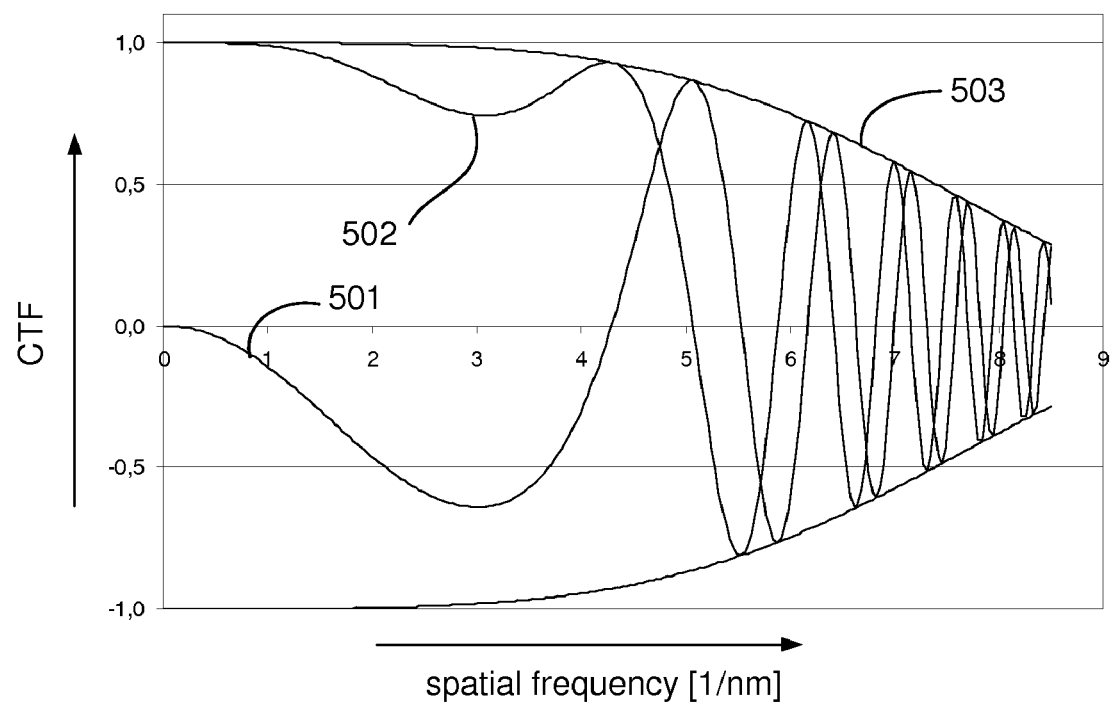
FIGS. 5A, 5B, 5C and 5D show schematically the effect of a defocus on the CTF.
Figure 5B:
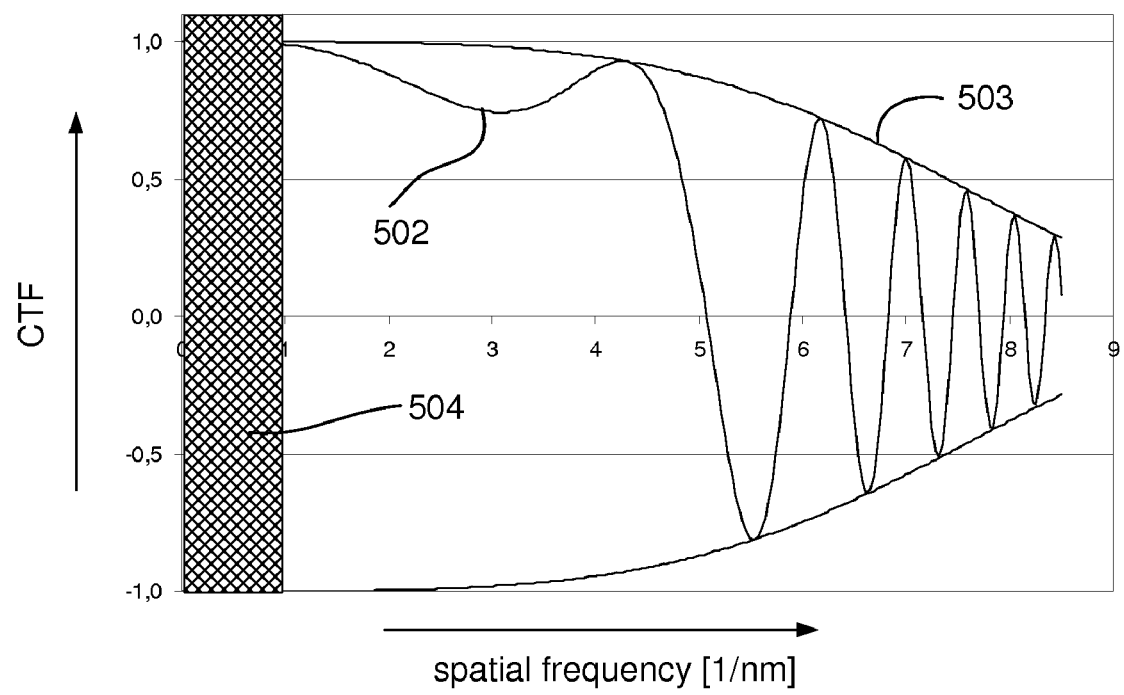
Figure 5C:
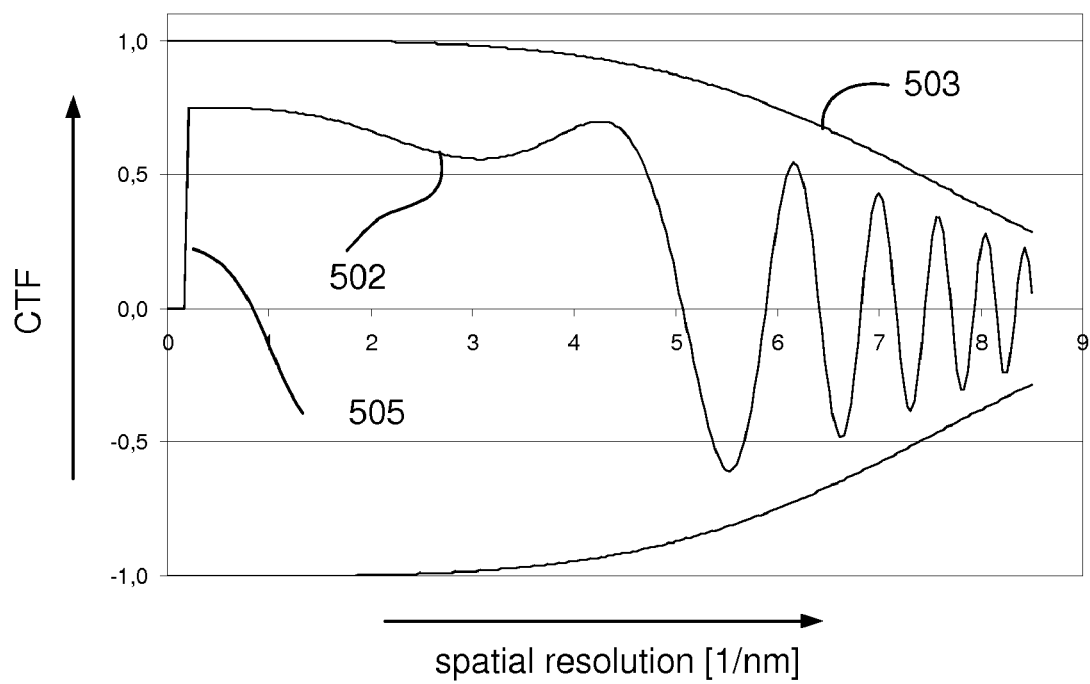
Figure 5D:
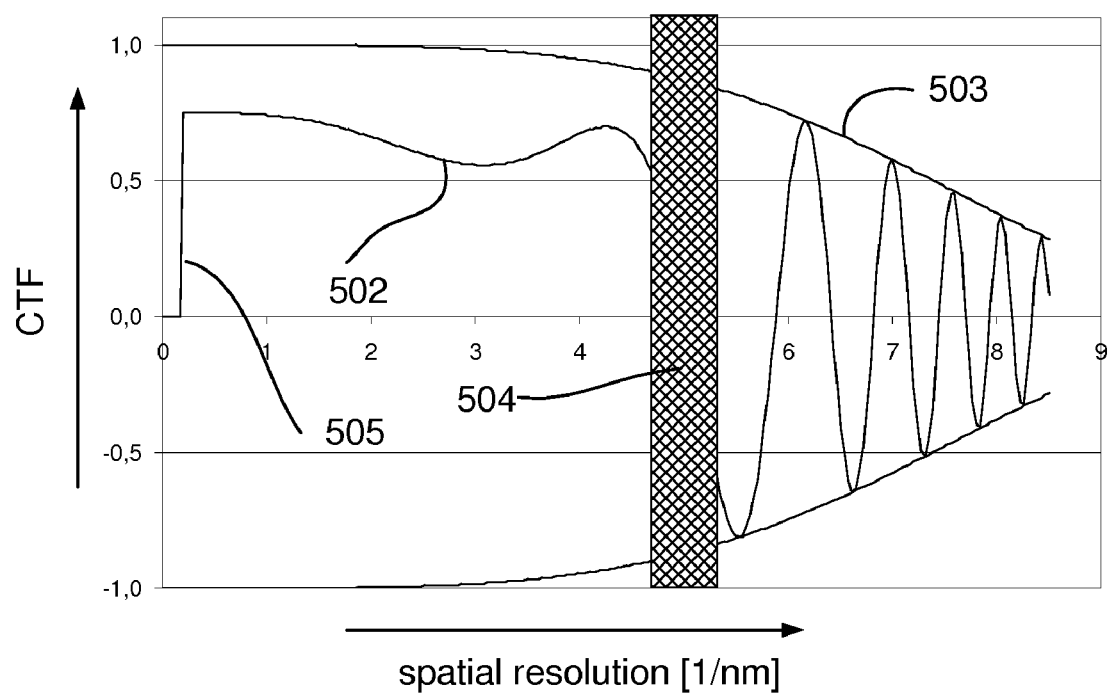

It is noted that these curves can therefore differ for different TEM's. As will be shown in FIGS. 5A and 5B the curves also vary for different defocus distances, that is: the distance between the specimen/object and the object plane of the objective lens.

As is clear from curve 401 in FIG. 4A, in a conventional TEM without a phase plate the CTF for spatial frequencies below 2 lines per nanometer is very low, and therefore structures larger than 0.5 nm are not imaged with good contrast.

For spatial frequencies between 2 to 4 lines per nanometer a first optimum occurs, followed by an oscillating behaviour of the CFT for spatial frequencies above 5 lines per nanometer.

In a TEM with a phase plate the CTF shows a maximum for low spatial frequencies, followed by an oscillating behaviour similar to the behaviour shown without a phase plate, but at different spatial frequencies. Large structures are thus well imaged by a TEM with a phase plate.

Figure 4B:
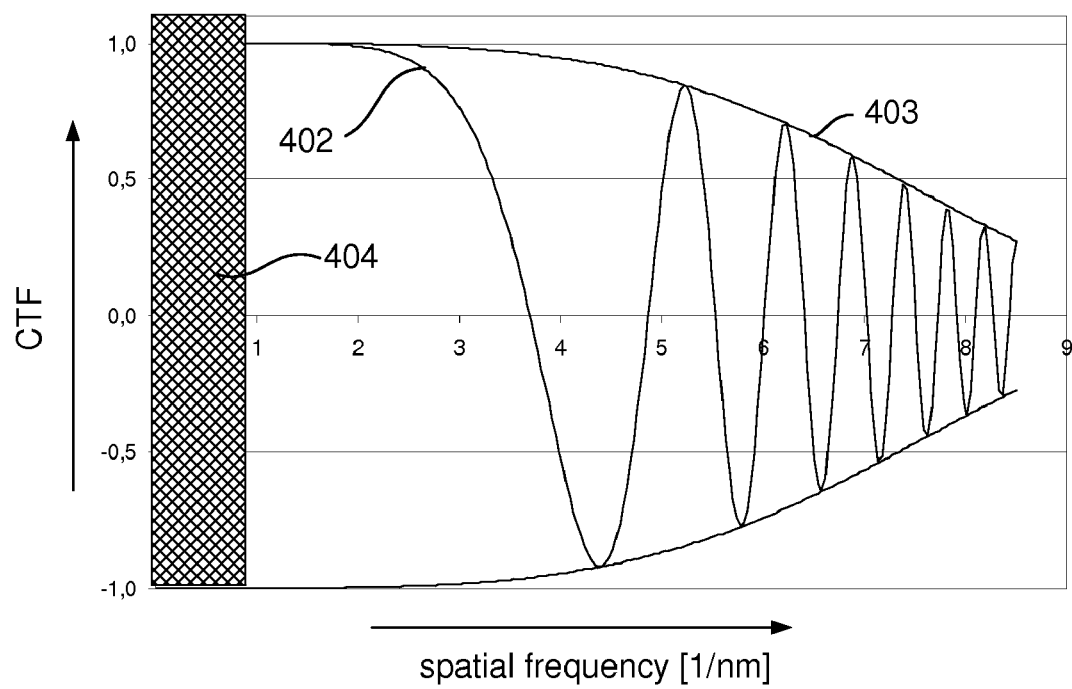

FIG. 4B shows an exemplary CTF of a TEM equipped with a Boersch phase plate, which intercepts all electrons corresponding with a spatial frequency below 0.9 nm$^{-1}$. FIG. 4B can be through to be derived from FIG. 4A, however, the central structure of the phase plate intercepts electrons that are scattered over a small angle, corresponding to a band-stop 404.

It is noted that electrons scattered over an extremely small angle are not intercepted by the phase plate, but pass through the central hole. However, as these experience the same phase shift as the unscattered electrons, the interference of these electrons with the unscattered electrons results in a CTF of essentially zero. Therefore the size of the inner hole of the central structure is not important, but only the outer diameter of the central structure.

Figure 4C:
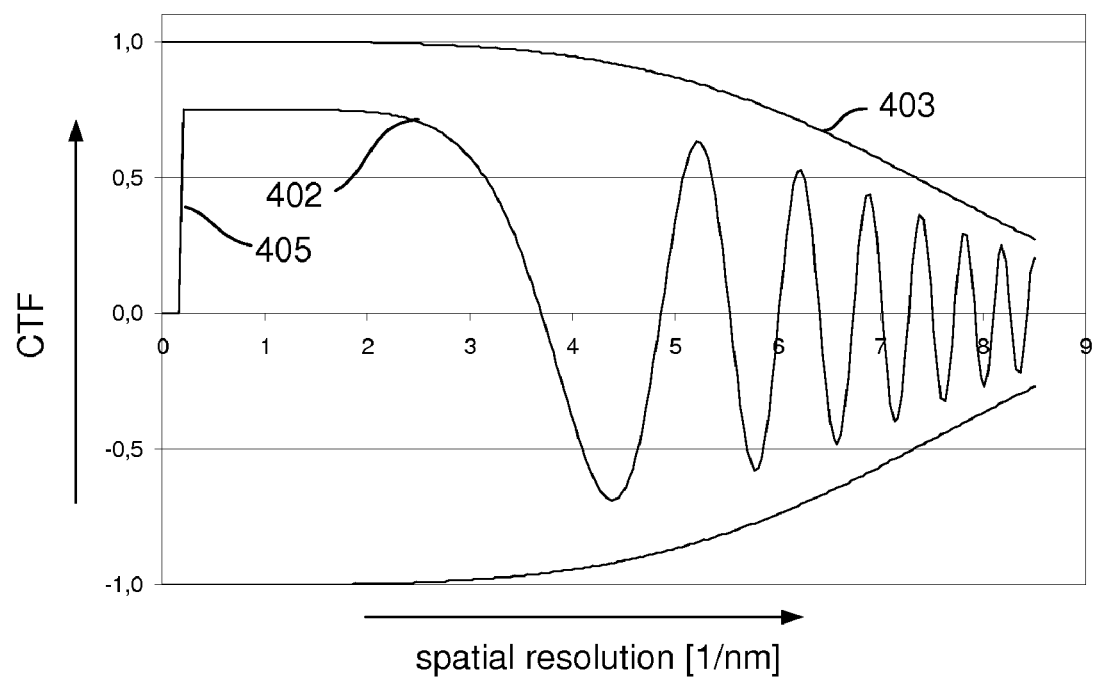

FIG. 4C shows an exemplary CTF of a TEM equipped with a Zernike phase plate. FIG. 4C can be thought to be derived from FIG. 4A, however, the CFT is lowered by 30% due to absorption and scattering of the foil, as earlier discussed. Also, for spatial frequencies below 0.2 lines per nm the CFT drops to a low value as for these scatter angle both the scattered and the unscattered electrons pass through the hole in the foil, so that no phase shift occurs between the two for such low spatial resolutions and the CTF behaves as a sine-like function for these low spatial frequencies.

Figure 4D:
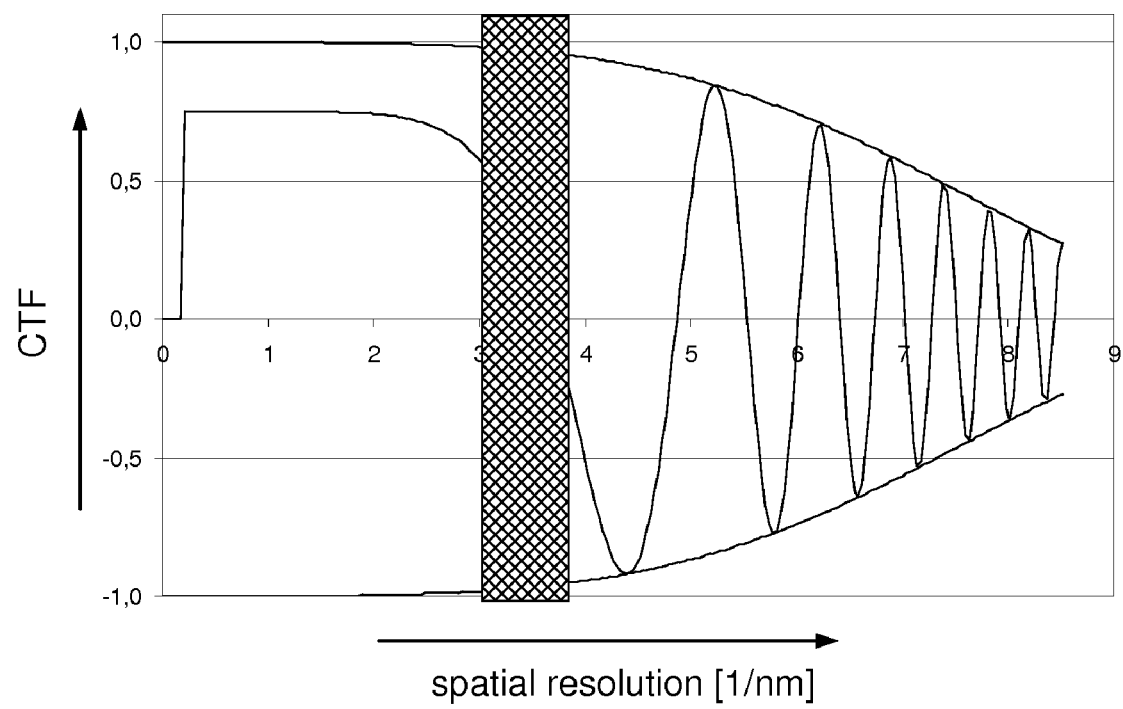

FIG. 4D shows an exemplary CTF curve of a phase plate according to the invention. FIG. 4D can be thought to be derived from FIGS. 4B and 4C. The band-stop, representing the range where electrons are intercepted by the central structure, is moved from a frequency range close to zero to a frequency range of e.g. 3-4 lines per nanometer. Unscattered electron experience a phase shift of $-\pi/2$ due to the field caused by the central structure. For scattered electrons representing spatial frequencies up to, in this example, 3 lines per nanometer the phase plate according to the invention behaves as a Zernike phase plate, and thus shows the CTF as shown in FIG. 4C.

For spatial frequencies above 4 lines per nanometer the phase plate shows a behaviour similar to that of a Boersch phase plate, and thus shows the CTF as shown in FIG. 4B. It is noted that in the spatial frequency range above 4 lines per nanometer no reduction of the CFT due to absorption or scattering of electrons occurs, as is the case in a Zernike phase plate.

It is further noted that the stop band may be positioned around e.g. the first null of the CTF, as a result of which only spatial frequencies are blocked in which the CFT is close to zero anyway.

FIGS. 5A, 5B, 5C and 5D show schematically the effect of a defocus on the CTF.

FIGS. 5A, 5B, 5C and 5D can be thought to be derived from FIGS. 4A, 4B, 4C and 4D respectively; however, a small defocus is introduced. As known to the person skilled in the art this results in a different CTF. The curves show an extended frequency range where low spatial frequencies correspond with a large CTF.

In other words: the first zero of the CTF occurs at a higher spatial frequency. The range of spatial frequencies blocked by the central structure is positioned at other spatial frequencies, as the CFT shows its first zero at another frequency. This can be done by using a phase plate with another dimension, or by using a different magnification between the back-focal plane of the TEM and the plane where the phase plate is positioned.

Figure 6:
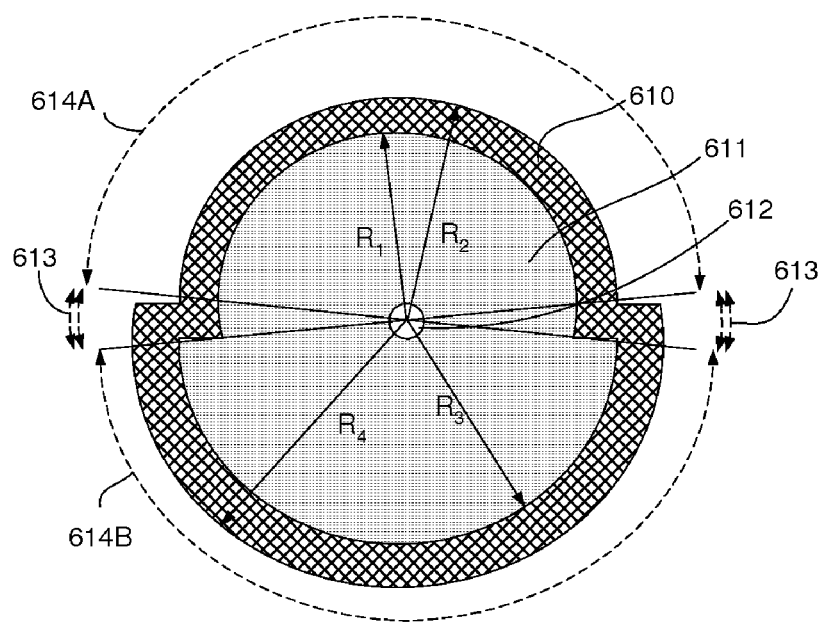
FIG. 6 schematically shows a preferred embodiment of the phase plate according to the invention, FIG. 7 schematically shows a TEM equipped with a phase plate according to the invention.

FIG. 6 schematically shows a preferred embodiment of the phase plate according to the invention.

FIG. 6 shows a top view of a phase plate, that is: a view from the position of the objective lens. A non-transparent structure 610 surrounds a transparent foil 611, which foil shows a hole 612 for passing the beam of unscattered particles. The non-transparent part is formed such that, except for a small angle 613, over angle 614A electrons are blocked that are scattered over a distance between R1 and R2, while over the remaining angle 614B electrons are blocked that are scattered over a distance between R3 and R4. Further R3 is chosen to be equal to R2. As a result in any direction, except for direction within angle 613, half the electrons which are scattered over a distance between R1 and R4 are intercepted and half are transmitted. As discussed earlier, discussing formulae [11] and [12], this results in an imaginary CFT for the frequencies where half the electrons are blocked.

It is noted that in the examples shown, the parameters have been tuned such that the phase shift between the scattered and unscattered beam is exactly $\pi/2$. It is remarked that a phase shift differing from that exact value also increases the CFT. Further it is noted that, for similar reasons, the phase shift between the particles passing through the foil and the particles passing outside the central structure need not be identical.

Figure 7:
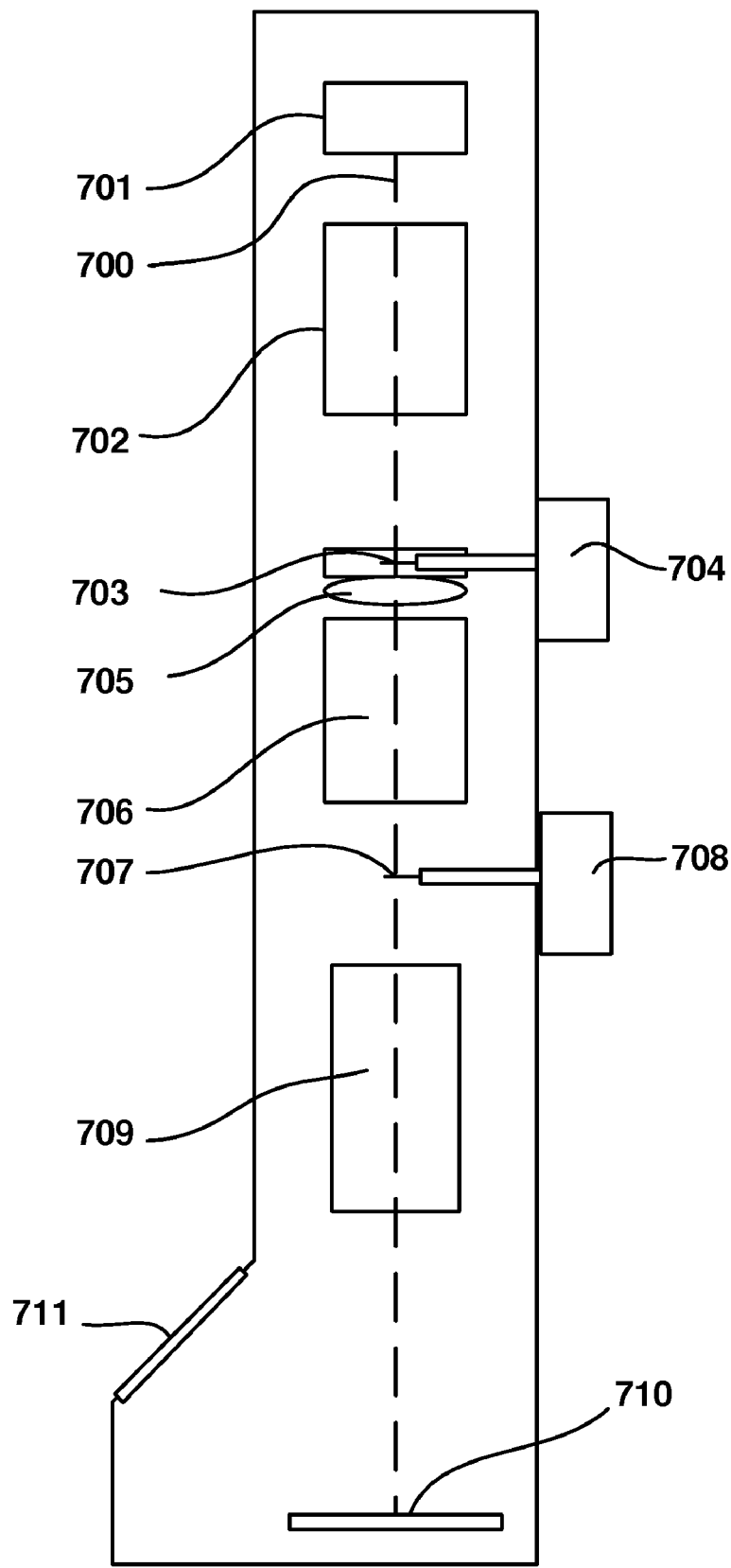

FIG. 7 schematically shows a TEM equipped with a phase plate according to the invention.

FIG. 7 shows a particle source 701 producing a beam of particles, such as electrons, along optical axis 700. The particles have a typical energy of 80-300 keV, although higher energies, e.g. 400 keV-1 MeV, or lower energies, e.g. 50 keV, may be used. The beam of particles is manipulated by condenser system 702 to form a parallel beam impinging on a sample 703, the sample positioned with a sample holder 704. The sample holder can position the sample with respect to the optical axis and may shift the sample in the plane perpendicular to the optical axis and tilt the sample with respect to said axis. Objective lens 705 forms a magnified image of the sample. The objective is followed by a magnifying system 706, e.g. a doublet of lenses. A phase plate 707 is placed in a plane conjugated to the back-focal plane of the objective lens, said conjugated plane positioned between the magnifying system and a projection system 709. The magnifying system can thus form an image of the back-focal plane with a variable magnification. The phase plate is positioned with a manipulator 708, allowing the phase plate to be centred round the optical axis. The projection system forms a magnified image of the sample on a detector 710, thereby revealing sample details of e.g. 0.1 nm. The detector may take the form of a fluorescent screen, or e.g. a CCD camera. In the case of e.g. a fluorescent screen the screen can be viewed via the glass window 711.

It is noted that, by properly setting the magnification of the magnifying system 706 the stop-band of the particles intercepted by the phase plate in the CTF can be tuned.

We claim as follows:

1. A phase plate for use in a particle-optical apparatus, said phase plate to be irradiated by a beam of particles, said phase plate comprising:
   a central structure that is non-transparent to particles,
   said central structure surrounded by an area transparent to particles;
   said central structure surrounding a foil transparent to particles, said foil surrounding a central through-hole for passing a part of the beam, said foil equipped to cause a phase shift between the part of the beam passing through the through-hole and the part of the beam passing through the foil; and said central structure equipped to cause a phase shift between the part of the beam passing through the foil and the through-hole and the part of the beam passing outside the central structure.

2. The phase plate of claim 1 in which the foil is a carbon foil.

3. The phase plate of claim 1 in which for at least one line in the plane of the phase plate and passing through the centre of the through-hole, said line thus intersecting the central structure at two opposite sides, the at least one line intersects the central structure from a distance R1 to a distance of R2 from the through-hole in one direction, and a distance from R3 to a distance of R4 from the through-hole in the other direction, and in which R3≧R2.

4. The phase plate of claim 3 in which the central structure is formed from two half-annuli, one half-annulus with inner radius R1 and outer radius R2, and the other half-annulus with an inner radius of R3 and an outer radius of R4, and in which R3≧R2, and the through-hole is located at the centre points of the two annuli from which the two half-annuli are formed.

5. Particle-optical apparatus equipped with a phase plate and equipped with an objective lens, said particle-optical apparatus illuminating a sample with a beam of particles the phase plate placed substantially in a plane where the beam illuminating the sample is focused, in which the phase plate is the phase plate according to claim 1.

6. The particle-optical apparatus of claim 5 in which, in working, the combined phase shift caused by the foil and the electric potential in the central structure results in a phase shift θ of substantially θ=n·π for the particles transmitted through the foil, with n an integer.

7. The particle-optical apparatus of claim 6 in which, in working, the combined phase shift caused by the foil and the electric potential in the central structure results in a phase shift θ of substantially θ=0.

8. The particle-optical apparatus according to claim 5 in which the apparatus is equipped to image the back-focal plane of the objective lens on the phase plate with a variable magnification.

9. Method of forming an image using a particle-optical apparatus equipped with an objective lens for illuminating a sample and a phase plate, the particle-optical apparatus equipped to image the plane where the objective lens forms a focus onto the phase plate, characterized in that:

the particle-optical apparatus is equipped with the phase plate according to claim 1, and the particle-optical apparatus is equipped to image the plane where the objective lens forms a focus onto the phase plate with a variable magnification, and the method comprises;

determining a desired lower spatial frequency range of the image, said lower spatial frequency range caused by the interference of particles transmitted through the foil with particles passing through the through-hole;

determining a desired higher spatial frequency range of the image, said higher spatial frequency range caused by the interference of particles transmitted around the central structure with particles passing through the through-hole; and adjusting the magnification with which the back-focal plane is imaged on the phase plate so that particles corresponding with said lower and the higher spatial frequency range are not intercepted by the central structure.

10. The method of claim 9 in which determining a lower spatial frequency range and determining a higher spatial frequency range takes the form of determining a central spatial frequency around which said lower spatial frequency range and said higher spatial frequency range are centred.

11. A particle-optical apparatus for forming an image of a sample comprising:

an objective lens for illuminating a sample with charged particles; and a phase plate defining a first region in which the phase of the charged particles passing through the first region is shiftable by an adjustable amount;

a second region within the first region, in which the phase of the charged particles passing through the second region is shifted by a fixed amount in addition to the adjustable amount; and a third region, outside of the first region, through which pass charged particles that did not pass though the first region, the charged particles passing through the three regions combining to form an image of a sample.

12. The particle-optical apparatus of claim 11 in which the phase plate include electrodes to provide in the first region an electric field that is adjustable to adjust the phase shift of charged particles passing through the first region and in which the second region includes a film that shifts the phase of the charged particles passing through the second region.

13. The particle-optical apparatus of claim 11 in which the phase of the charged particles passing through the third region is not shifted.

14. The particle-optical apparatus of claim 11 in which the sum of the fixed amount of phase shift in the second region and the adjustable phase shift in the first region results in a phase shift such that particles passing through the second region differ in phase from particles passing though the third region by n·π radians, with n being an integer.

15. The particle-optical apparatus of claim 11 in which the fixed amount of phase shift in the second region is equal in magnitude and opposite in sign to the adjustable phase shift in the first region.

16. The particle-optical apparatus of claim 11 in which the second region is defined by a film through which the charged particles pass and in which the portion of the first region that is not included in the second region is a hole in the film defining second region.

17. A particle-optical apparatus for forming an image of a sample comprising:

an objective lens for illuminating a sample; and a phase plate for shifting the phase of some particles in a beam relative to other particles in the beam, the phase plate defining three regions through which charged particles pass:

a foil region defined by a foil that shifts the phase of charged particles passing through the foil by a fixed amount;

a through-hole region defined by a hole in the foil; and an exterior region outside the outer diameter of the foil, the charged particles passing through the fixed shift region, the through-hole region, and the exterior region combining to form an image of the sample.

18. The particle-optical apparatus of claim 17 in which the phase plate comprises two partial annuluses having different inner diameters so that if a particle scattered at an angle of α impacts one of the annuluses, a second particle scattered at an angle −α will not impact the second annulus, except at the areas at which the annuluses connect.

19. The particle-optical apparatus of claim 18 further comprising electrode to provide an electric field to shift the phase of the charged particles passes through the foil region and the through-hole region.

20. The particle-optical apparatus of claim 18 in which the shape of the foil region is defined by two partial annuluses having different inner diameters such that if a particle scattered at an angle of α impacts one of the annuluses, a second particle scattered at an angle −α will not impact the second annulus, except at the areas at which the annuluses connect.

21. Method of forming an image using a particle-optical apparatus equipped with an objective lens for illuminating a sample and a phase plate, the particle-optical apparatus equipped to image the plane where the objective lens forms a focus onto the phase plate, comprising:

passing a first set of charged particles through a first region in which the phase of the charged particles is shifted by a first amount;

passing a subset of the first set of charged particles through a second region, which is a subset of the first region and in which the charged particles in the subset are phase shifted by second amount;

passing a second set of charged particles though a third region in which the charged particles are phase shifted by a third amount;

combining the charged particles in the first and second sets of charged particles to form an image.

22. The particle-optical apparatus of claim 21 in which the second amount and the third amount differ by n·π, n being an integer.

* * * * *